(12) United States Patent
Huang et al.

(10) Patent No.: US 11,195,934 B2
(45) Date of Patent: Dec. 7, 2021

(54) STRUCTURE AND METHOD FOR BI-LAYER SELF-ALIGNED CONTACT

(71) Applicant: Taiwan Semiconductor Manufacturing Co., Ltd., Hsin-Chu (TW)

(72) Inventors: Lin-Yu Huang, Hsinchu (TW); Li-Zhen Yu, Taipei (TW); Chia-Hao Chang, Hsinchu (TW); Cheng-Chi Chuang, Taipei (TW); Yu-Ming Lin, Hsinchu (TW); Chih-Hao Wang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/895,534

(22) Filed: Jun. 8, 2020

(65) Prior Publication Data

US 2021/0066470 A1    Mar. 4, 2021

Related U.S. Application Data

(60) Provisional application No. 62/893,379, filed on Aug. 29, 2019.

(51) Int. Cl.
| | | |
|---|---|---|
| *H01L 29/66* | (2006.01) | |
| *H01L 29/423* | (2006.01) | |
| *H01L 21/3105* | (2006.01) | |
| *H01L 21/311* | (2006.01) | |
| *H01L 21/3213* | (2006.01) | |

(52) U.S. Cl.
CPC ...... *H01L 29/665* (2013.01); *H01L 21/31053* (2013.01); *H01L 21/31111* (2013.01); *H01L 21/32133* (2013.01); *H01L 29/42372* (2013.01); *H01L 29/66545* (2013.01)

(58) Field of Classification Search
CPC ............. H01L 29/665; H01L 21/31053; H01L 21/31111; H01L 21/32133; H01L 29/42372; H01L 29/66545
See application file for complete search history.

(56) References Cited

U.S. PATENT DOCUMENTS

| | | | |
|---|---|---|---|
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |

(Continued)

*Primary Examiner* — Zandra V Smith
*Assistant Examiner* — Andre C Stevenson
(74) *Attorney, Agent, or Firm* — Haynes and Boone, LLP

(57) ABSTRACT

The present disclosure provides embodiments of a semiconductor structure having bi-layer self-aligned contact. The semiconductor structure includes a gate stack disposed on a semiconductor substrate and having a first height, a spacer disposed on a sidewall of the gate stack and having a second height greater than the first height, and a first etch stop layer disposed on a sidewall of the gate spacer and having a third height greater than the second height. The semiconductor structure further includes a first dielectric layer disposed over the gate stack and contacting the gate spacer and the first etch stop layer and a second dielectric layer disposed on the first dielectric layer and contacting the first etch stop layer.

20 Claims, 10 Drawing Sheets

(56) References Cited

U.S. PATENT DOCUMENTS

| | | |
|---|---|---|
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,567,814 B2 | 2/2017 | Wu et al. |
| 10,510,867 B2 * | 12/2019 | Hsieh ................ H01L 29/41791 |
| 2010/0213530 A1 * | 8/2010 | Kim .................. H01L 27/11521 |
| | | 257/316 |
| 2020/0135880 A1 * | 4/2020 | Chen .................. H01L 29/0847 |

* cited by examiner

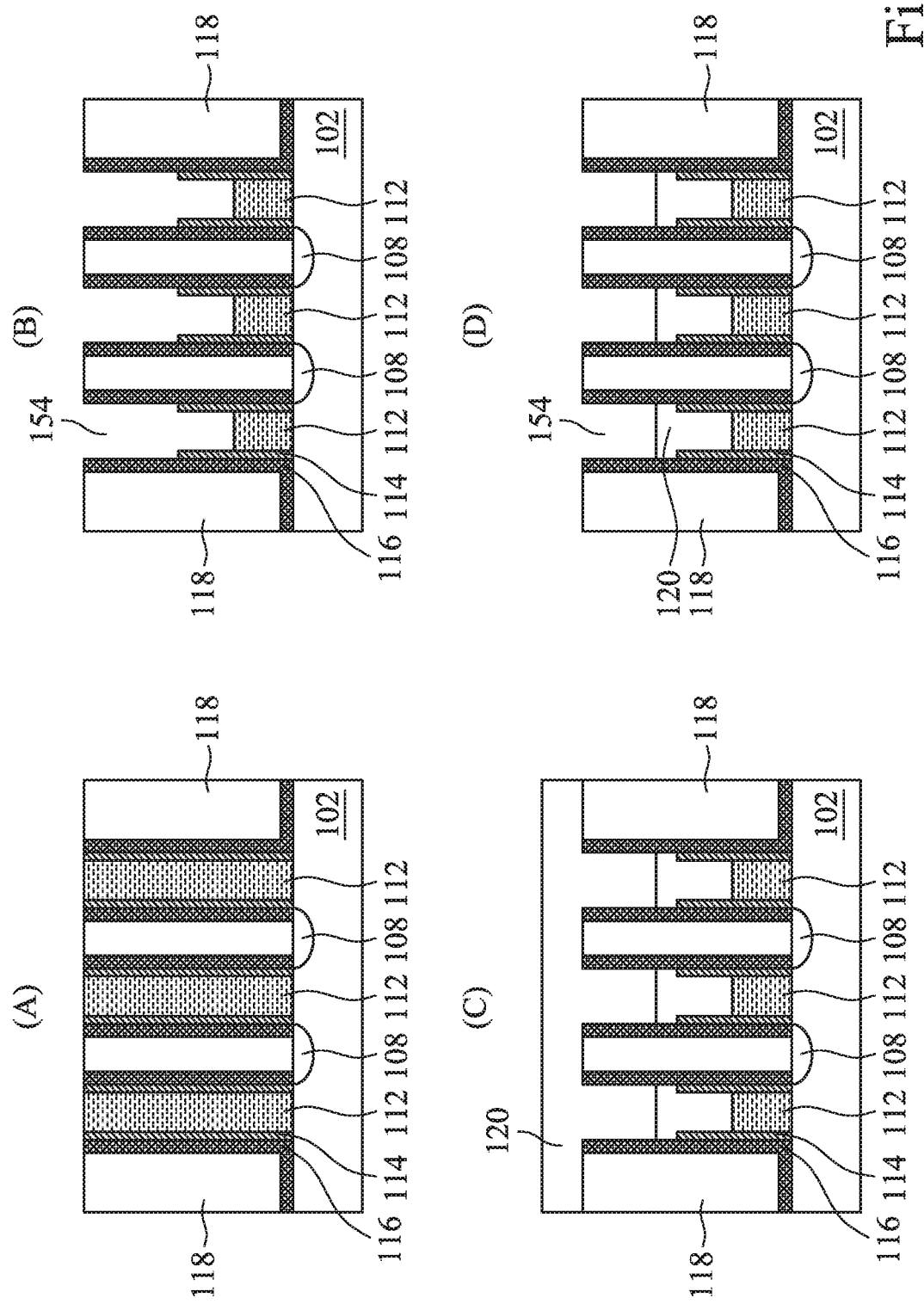

STRUCTURE AND METHOD FOR BI-LAYER SELF-ALIGNED CONTACT

PRIORITY DATA

The present application claims the benefit of U.S. Provisional Application No. 62/893,379, entitled "Structure and Method for Gate with Bi-Layer Roof T-Shape Self-Aligned Contact Helmet," filed Aug. 29, 2019, herein incorporated by reference in its entirety.

BACKGROUND

Integrated circuits have progressed to advanced technologies with smaller feature sizes. In these advanced technologies, the devices (such as transistors) shrink and therefore induce various issues, such as contact to gate bridging concern. Furthermore, three dimensional transistors, such as field effect transistors with fin active regions (FinFETs) or gate-all-around (GAA) field effect transistors, are desired to have effective gate-channel coupling, reduced device dimensions (such as narrow fin width for short channel control) and enhanced device performance. However, along with the scaling down of the device sizes, various conductive features including metal gate and interconnection features, such as contacts and vias, are continuously shrunk, leading to various challenges, such as high connection resistance, etch loss and alignment issues. To shrink the feature size while boosting the contact resistance, reducing the overly shift and decreasing the etch loss, there are various challenges including material integration, processing and designing constrains. This is getting even worse on FinFETs and GAA field effect transistors. Therefore, there is a need for a conductive structure and method to address these concerns for enhanced circuit performance and reliability.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
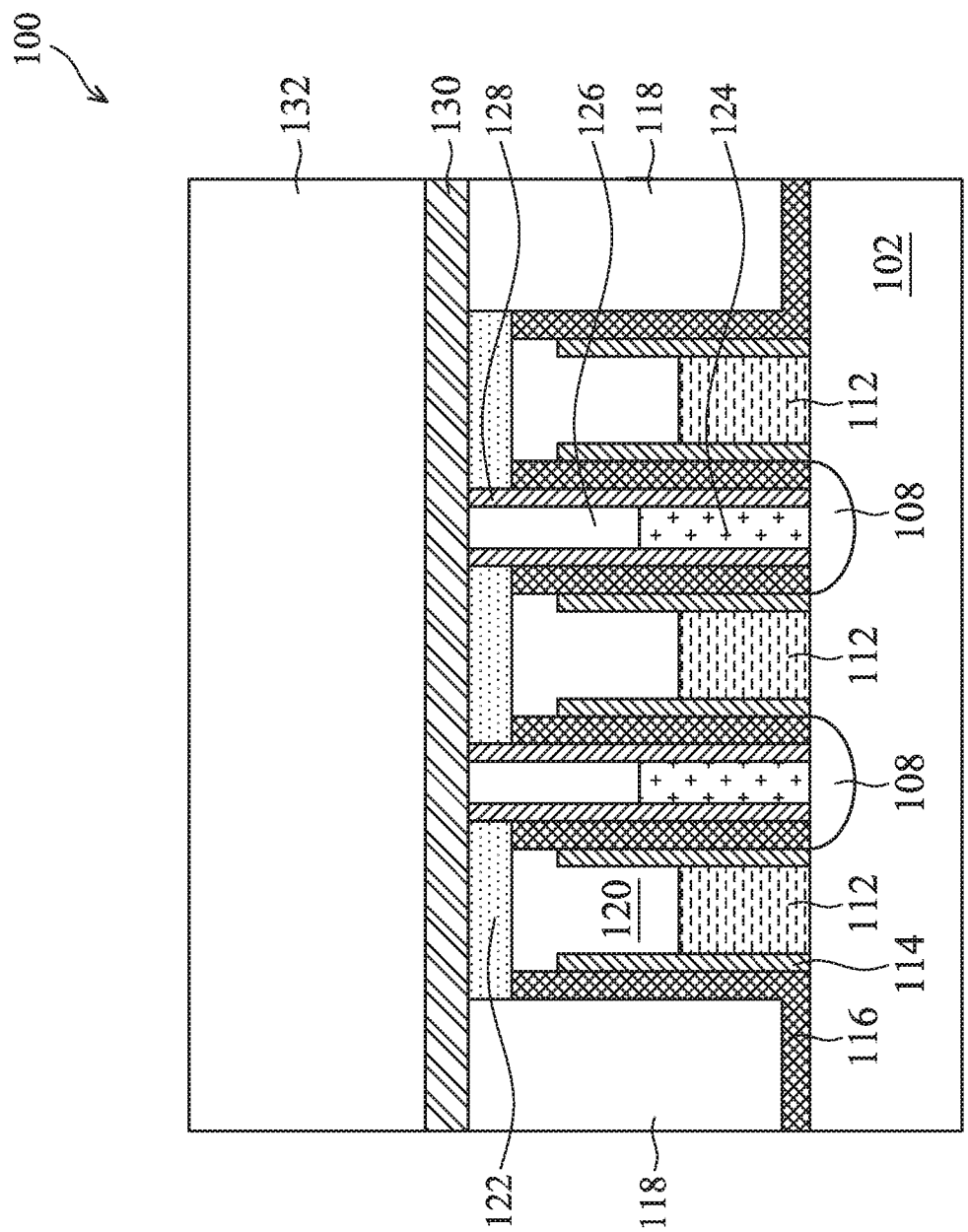
FIG. 1 is a sectional view of a semiconductor structure 100 according to some embodiments, illustrating a bi-layer T-shape self-aligned contact (SAC).

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for simplicity and clarity and does not in itself dictate a relationship between the various embodiments and/or configurations discussed.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc., as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure provides a semiconductor structure having a gate stack with a bi-layer roof T-shaped self-aligned contact helmet to provide the best etching window (or etch selectivity) during Via Gate (VG) etching, Via Drain (VD) etching, and Metalized Drain (MD) etching. Also, this invention prevents VG to MD leakage problem, which also solves VG resolution limit and boosts device performance at the same time. In the above description, VG refers to a via landing on the gate stack; MD refers to a via landing on a source/drain feature; and VD refers to a via landing on MD. The disclosed structure and a method of making the same are collectively described in accordance with various embodiments.

FIG. 1 is a sectional view of a semiconductor structure 100 according to some embodiments. The semiconductor structure 100 includes a semiconductor substrate 102; various devices (such as field effect transistors, memory cells and/or passive devices) formed on the semiconductor substrate 102; and an interconnection structure coupling the devices into an integrated circuit. More particularly, the semiconductor structure 100 includes a source/drain 108 and a gate stack 112 of a field effect transistor. The gate stack 112 includes a gate dielectric layer and a gate electrode on the gate dielectric layer. The gate stack 112 is interposed between the source/drain 108. The semiconductor structure 100 further includes a gate spacer 114 disposed on sidewalls of the gate stack 112, an etch stop layer 116 disposed on sidewalls of the gate spacer 114, and a first interlayer dielectric (ILD) layer 118 surrounding the gate stack 112, the gate spacer 114 and the etch stop layer 116. In some embodiments, the etch top layer 116 is extended between the first ILD layer 118 and the semiconductor substrate 102. Furthermore, the gate stack 112 is recessed with a first height; the gate spacer 114 is recessed to a second height greater than the first height; the etch stop layer 116 is recessed to a third height greater than the second height; and the first ILD layer 118 has a fourth height greater than the third height. A first self-aligned contact (SAC) dielectric feature 120 is disposed on the gate stack 112, and a second SAC dielectric feature 122 is disposed on the first SAC dielectric feature 120. The first and second SAC dielectric features 120, 122 are different in composition to achieve etch selectivity during later etch, such as via etch. For example, the first SAC dielectric feature 120 includes silicon oxide and the second SAC dielectric feature 122 includes silicon nitride. The first SAC dielectric feature 120 laterally contacts the gate spacer 114 and the etch stop layer 116. The first SAC dielectric feature 120 includes a top surface being coplanar with a top surface of the etch stop layer 116. The first SAC dielectric feature 120 has a T-shape. The second SAC dielectric feature 122 laterally contacts the first ILD layer 118 and contacts a top surface of the etch stop layer 116. The second SAC dielectric feature 122 includes a top surface being coplanar with a top surface of the first ILD layer 118. In some embodiments, the first and second SAC dielectric features 120, 122 collectively include a T-shape.

The semiconductor structure 100 also includes an S/D contact 124 landing on the source/drain 108, a third SAC dielectric feature 126 on the S/D contact 124 and may further include a liner 128 on sidewalls of the S/D contact 124 and the third SAC dielectric feature 126. The third SAC dielectric feature 126 may have a different composition from those of the first and second SAC dielectric features 120, 122 for further etch selectivity. The semiconductor structure 100 also includes a metal contact etch stop layer 130 and a second ILD layer 132 on the metal contact etch stop layer 130.

There are various advantages according to various embodiments. For example, the bi-layer SAC structure provides two types of materials to satisfy MD/VG/VD etching. The second SAC dielectric feature 122 offers selectivity during MD etching and VD etching; the first SAC dielectric feature 120 offers selectivity during VG etching, which is easier to meet scaling requirement with more flexibility. The protrusion of the etch stop layer 116 provides more VG to MD TDDB and leakage window, which enables the design of Slot VG. Slot VG reduces VG resistance and overcomes VG resolution limit (especially in more advanced nodes).

Figure 2:
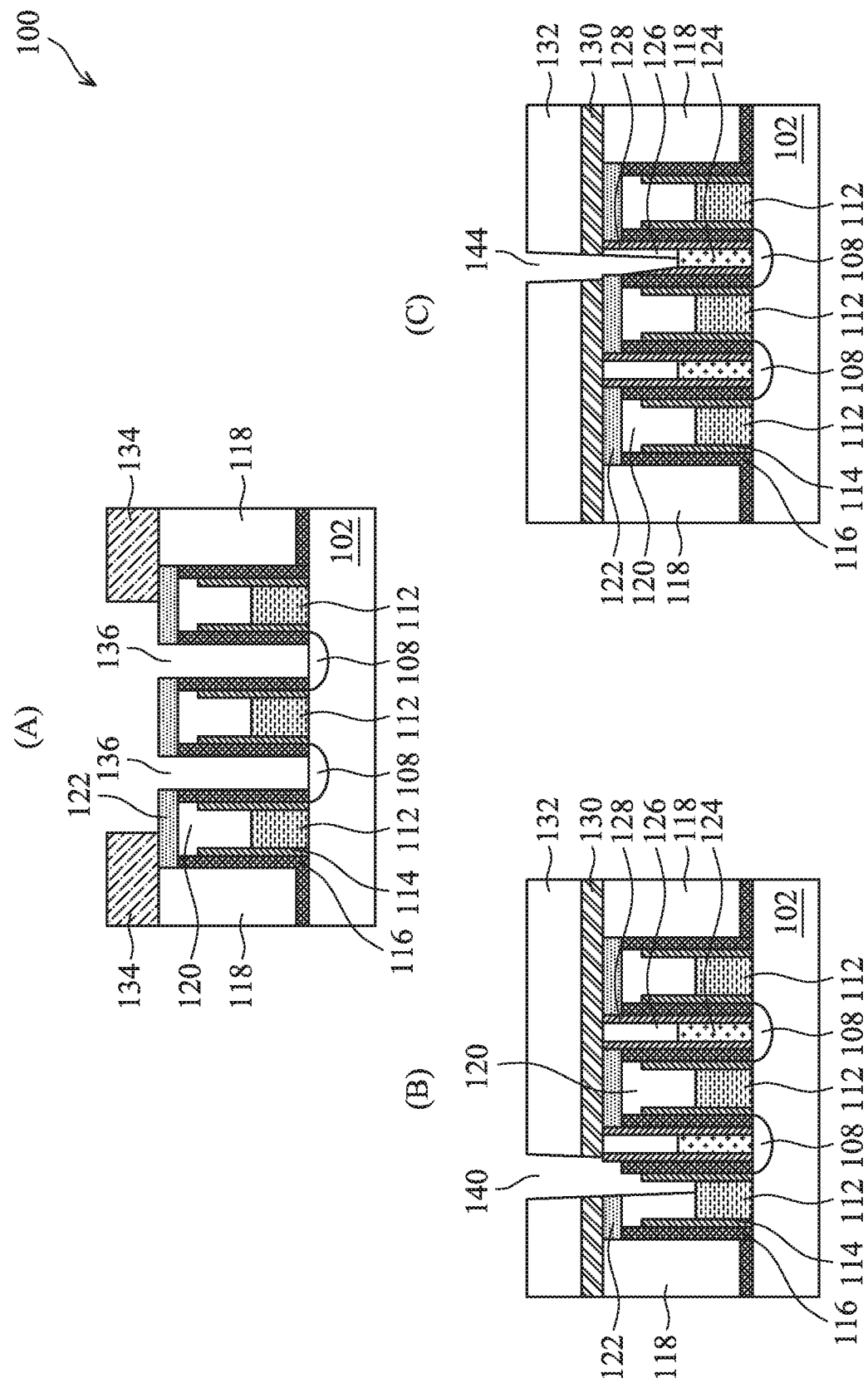
FIGS. 2(A), 2(B), and 2(C) are sectional views of the semiconductor structure 100 according to various embodiments, illustrating various etch selectivity.

FIG. 2 is a sectional view of the semiconductor structure 100 according to various embodiments, illustrating various etch selectivity, such as first ILD layer 118/second SAC dielectric feature 122 selectivity in (A); first SAC dielectric feature 120/gate spacer 114 selectivity in (B); and third SAC dielectric feature 126 and liner 128/second SAC dielectric feature 122 selectivity in (C).

Referring to FIG. 2(A), the semiconductor structure 100 includes a patterned hard mask 134 over a portion of the first ILD layer 118 for preventing etching thereof. The patterned hard mask 134 physically contacts top surfaces of a portion of the first ILD layer 118 and a portion of the second SAC dielectric feature 122. The semiconductor structure 100 has undergone MD etching, which purpose is to form an S/D contact opening 136 landing on the source/drain 108. The MD etching forms the S/D contact opening 136 where a portion of the first ILD layer 118 has been etched away. The S/D contact opening 136 is formed over the source/drain 108 and disposed between etch stop layers 116 of adjacent gate stacks 112 and between lateral edges of the second SAC dielectric features 122. The MD etching provides first ILD layer 118/second SAC dielectric feature 122 etch selectivity in that the first ILD layer 118 is etched away using a first etching process while the second SAC dielectric feature 122 is resistant to the first etching process.

Referring to FIG. 2(B), the semiconductor structure 100 has undergone VG etching, which purpose is to form a gate contact opening 140 landing on the gate stack 112. The VG etching forms the gate contact opening 140 where portions of the first and second SAC dielectric features 120, 122 have been etched away. The gate contact opening 140 is formed over the gate stack 112 and disposed between inner sidewalls of the gate spacers 114 and the etch stop layers 116 of each gate stack 112. The VG etching provides first SAC dielectric feature 120/gate spacer 114 etch selectivity in that the first SAC dielectric feature 120 is at least partially etched away using a second etching process while the gate spacer 114 is resistant to the second etching process.

Referring to FIG. 2(C), the semiconductor structure 100 has undergone VD etching, which purpose is to form an opening 144 landing on the S/D contact 124, in this case the S/D contact 124 being the MD feature of the semiconductor structure 100. The VD etching forms the opening 144 where portions of the third SAC dielectric feature 126 and the liner 128 have been etched away. The opening 144 is formed over the S/D contact 124 and disposed between lateral edges of the second SAC dielectric features 122. The VD etching provides third SAC dielectric feature 126 and liner 128/ second SAC dielectric feature 122 etch selectivity in that the third SAC dielectric feature 126 and liner 128 are at least partially etched away using a third etching process while the second SAC dielectric feature 122 is resistant to the third etching process. The first, second, and third etching processes may include a dry etching process, a wet etching process, a reactive ion etching (RIE) process, other suitable methods, or combinations thereof. A dry etching process may use chlorine-containing gases, fluorine-containing gases, and/or other etching gases. Wet etching solutions may include ammonium hydroxide ($NH_4OH$), hydrofluoric acid (HF) or diluted HF, deionized water, tetramethylammonium hydroxide (TMAH), and/or other suitable wet etching solutions. In some embodiments, the etching process includes multiple etching steps with different etching chemistries, designed for etching selectivity to form features having a desired profile.

Figure 3:
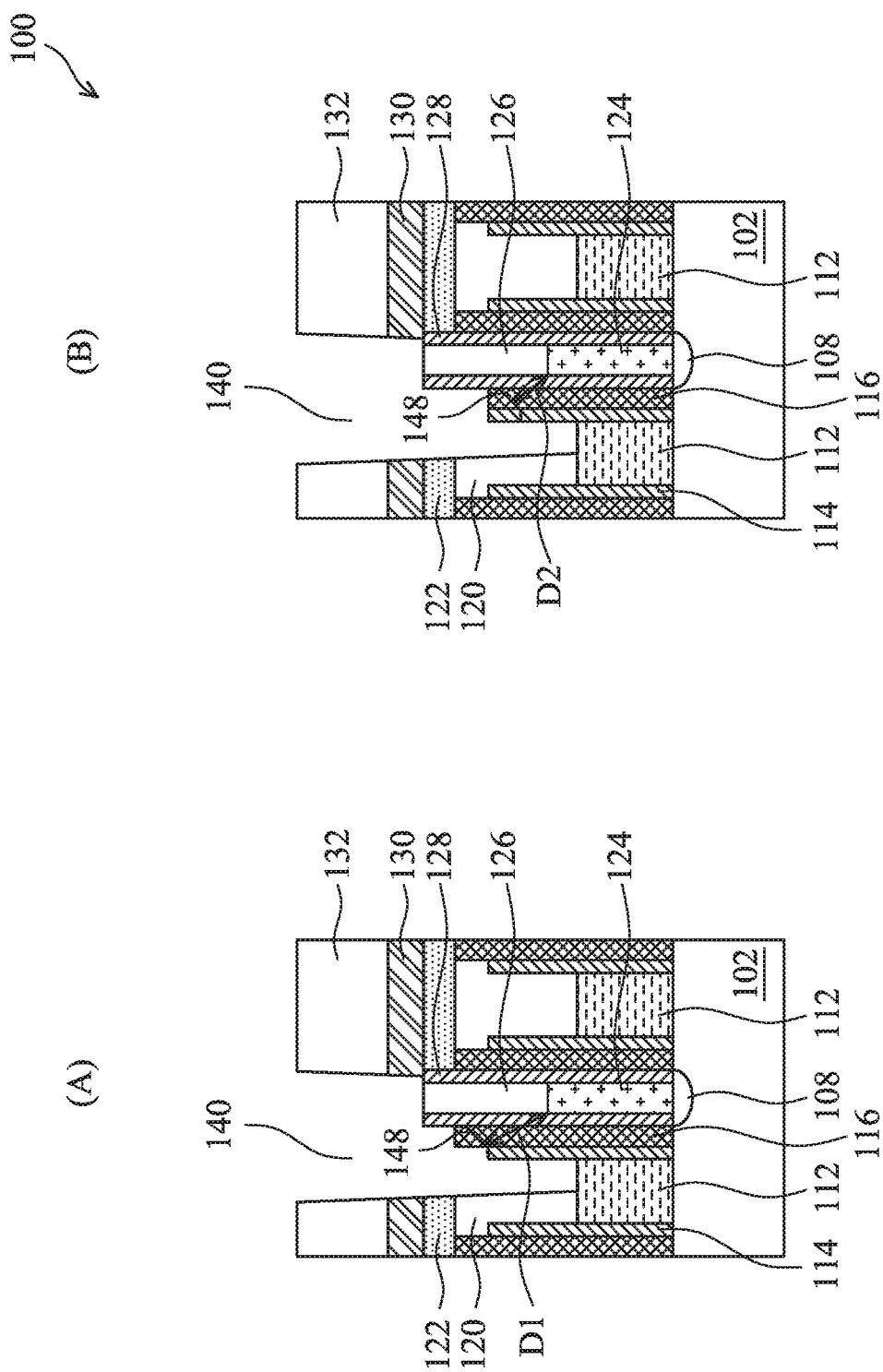
FIGS. 3(A) and 3(B) are magnified sectional views of the semiconductor structure 100 of FIG. 2(B) according to various embodiments, illustrating various VG to MD distance.

FIGS. 3(A) and 3(B) are magnified sectional views of the semiconductor structure 100 of FIG. 2(B) according to various embodiments, illustrating various VG to MD distance, the VG to MD distance in this case being a distance between the S/D contact 124 and the gate contact opening 140 formed by VG etching. In some implementations, embodiments illustrated in FIG. 3 suffer from VG lithography overlay shift. Referring to FIG. 3(A), the etch stop layer 116 includes an upper protrusion extending above a top surface of the gate spacer 114 where the etch stop layer 116 is at the third height greater than the second height of the gate spacer 114. In some embodiments, the semiconductor structure 100 undergoes etching loss to form a gate spacer 114/etch stop layer 116 profile 148 during VG etching forming first VG to MD distance D1. Referring to FIG. 3(B), the etch stop layer 116 lacks the upper protrusion so that the etch stop layer 116 does not extend above the top surface of the gate spacer 114. In this embodiment, the etch stop layer 116 is instead at the second height equal to the second height of the gate spacer 114. In some embodiments, the semiconductor structure 100 undergoes etching loss to form the profile 148 during VG etching forming second VG to MD distance D2. The VG to MD distance D1 provides more VG to MD TDDB and leakage window fulfilling design requirements, while the VG to MD distance D2 results in TDDB leakage.

Figure 4:
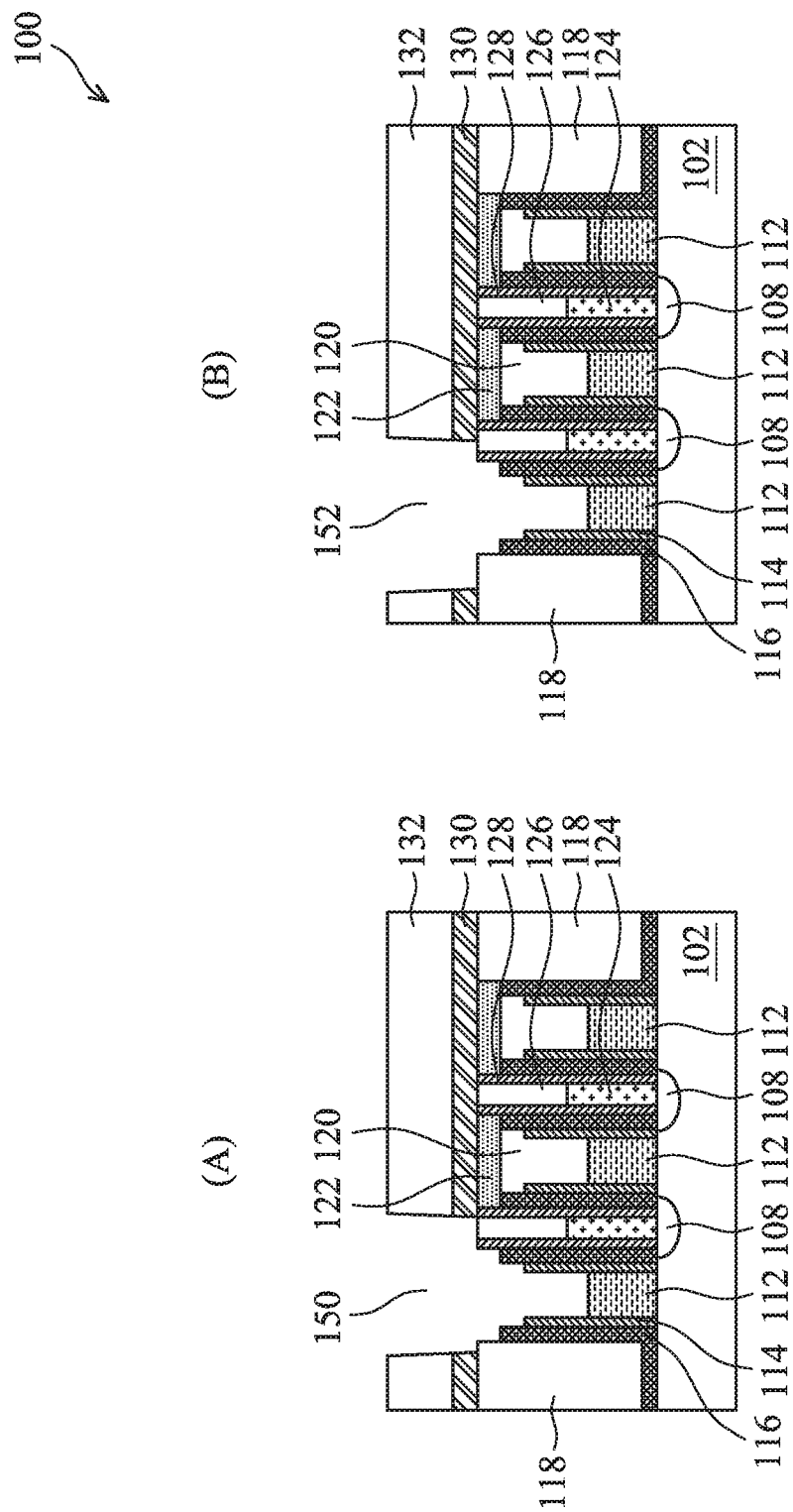
FIG. 4 is a sectional view of the semiconductor structure 100 according to various embodiments, illustrating slot VG with overlay shift in (A) and slot VG with no overlay shift in (B).

FIG. 4 is a sectional view of the semiconductor structure 100 according to various embodiments, illustrating slot VG with overlay shift in (A) and slot VG with no overlay shift in (B). Referring to FIG. 4(A), slot VG etching forms a gate contact opening slot 150 landing on the gate stack 112. The slot VG etching forms the slot 150 where the first and second SAC dielectric features 120, 122 have been etched away. In some implementations, the first and second SAC dielectric features 120, 122 are completely removed by the etching process to form the slot 150. The slot 150 is formed over the gate stack 112 and disposed between inner sidewalls of the gate spacers 114 and the etch stop layers 116 of each gate stack 112. The slot VG etching provides first SAC dielectric feature 120/gate spacer 114 etch selectivity in that the first SAC dielectric feature 120 is etched away using the second etching process while the gate spacer 114 is resistant to the second etching process. In some embodiments, the slot VG etching is performed using an etching process different than the second etching process of the VG etching. The upper protrusion of the etch stop layer 116 and/or etching selectivity enables design of slot VG without TDDB leakage due to low VG to MD distance even with overlay shift.

Referring to FIG. 4(B), slot VG etching forms a gate contact opening slot 152. In this embodiment, the slot VG etching is performed with no overlay shift. Even with overlay shift in slot VG etching to form the slot 150, both the slot 150 and the slot 152 benefit from increasing VG resolution limit (lower resolution limit resulting in features being too small to pattern), reducing VG resistance (Rg) by increasing landing area, and eliminating Rg variation induced by overlay shift.

Figure 5:
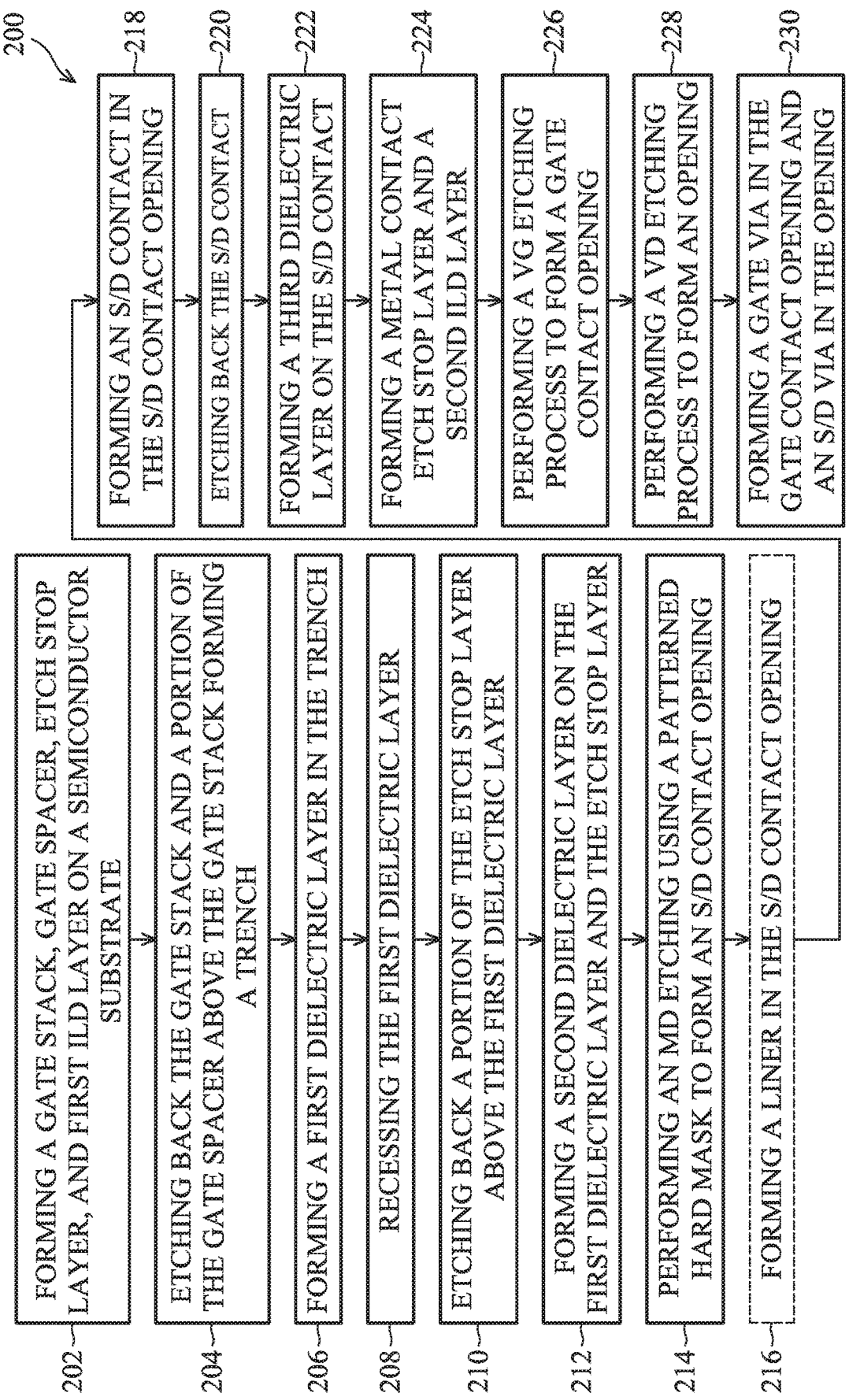
FIG. 5 is a flowchart of a process 200 for fabricating the semiconductor structure 100 according to various embodiments.
Figure 6:
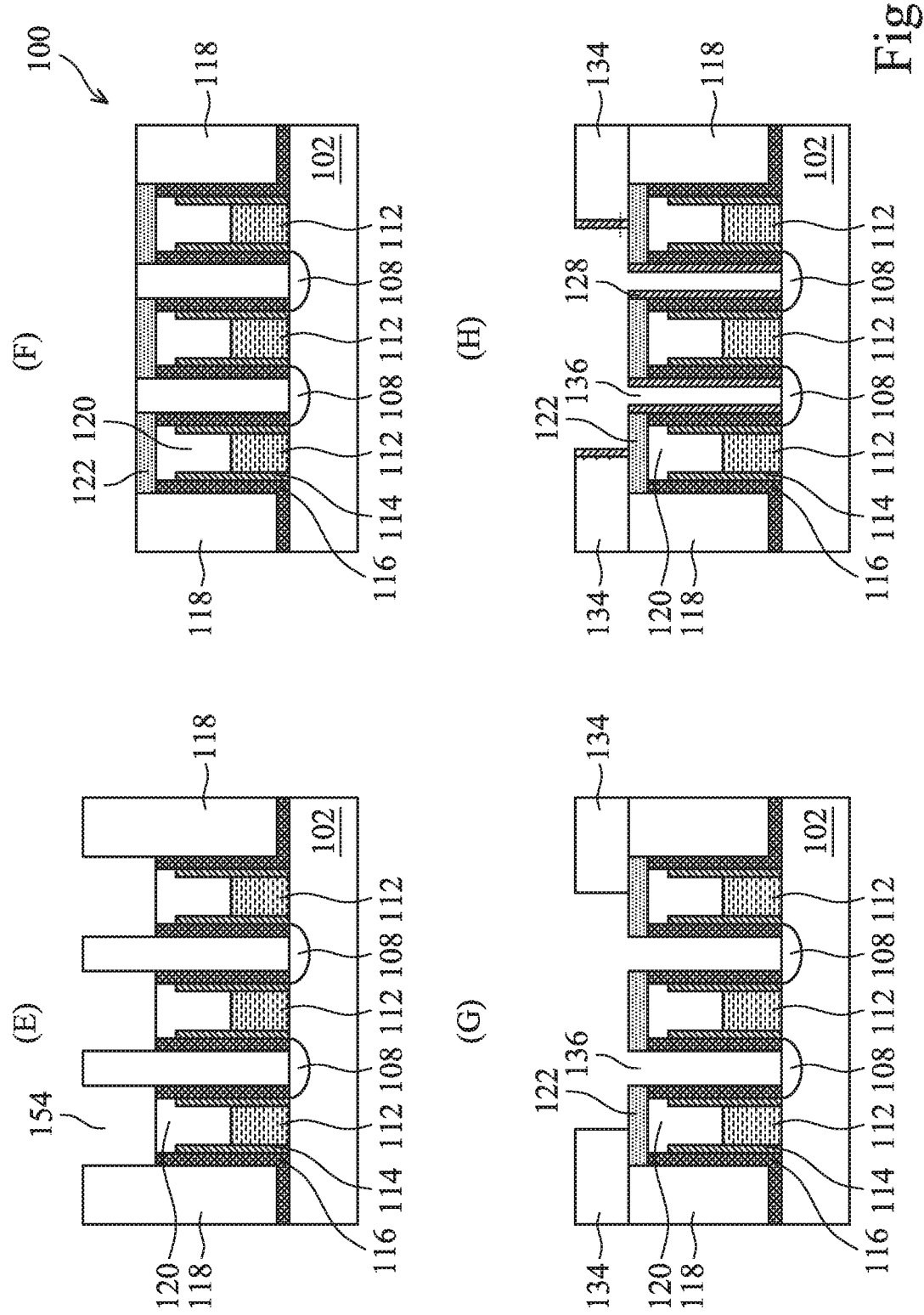
FIGS. 6(A)-6(O) are sectional views of the semiconductor structure 100 at various fabrication stages according to various embodiments.
Figure 6:
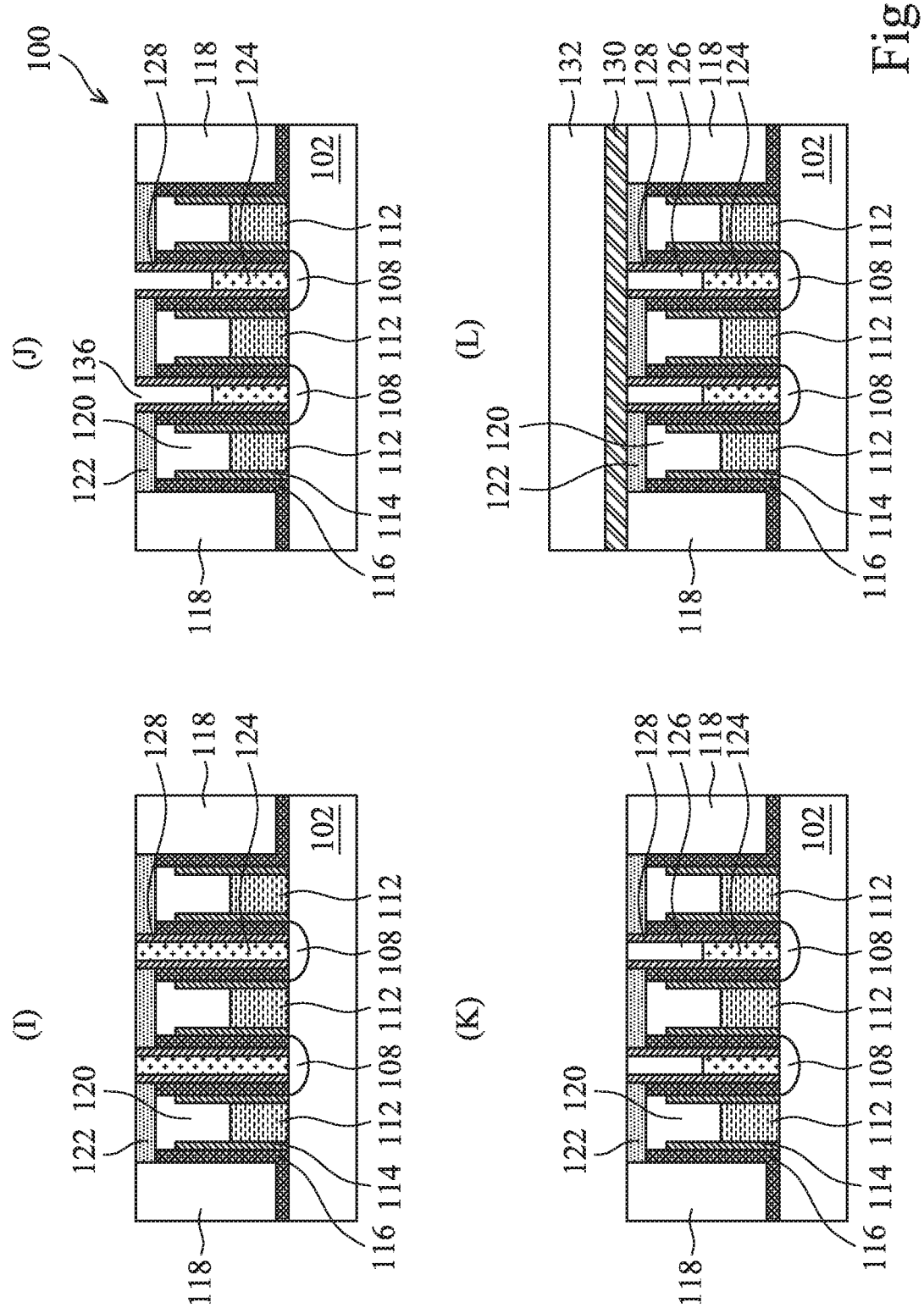
Figure 6:
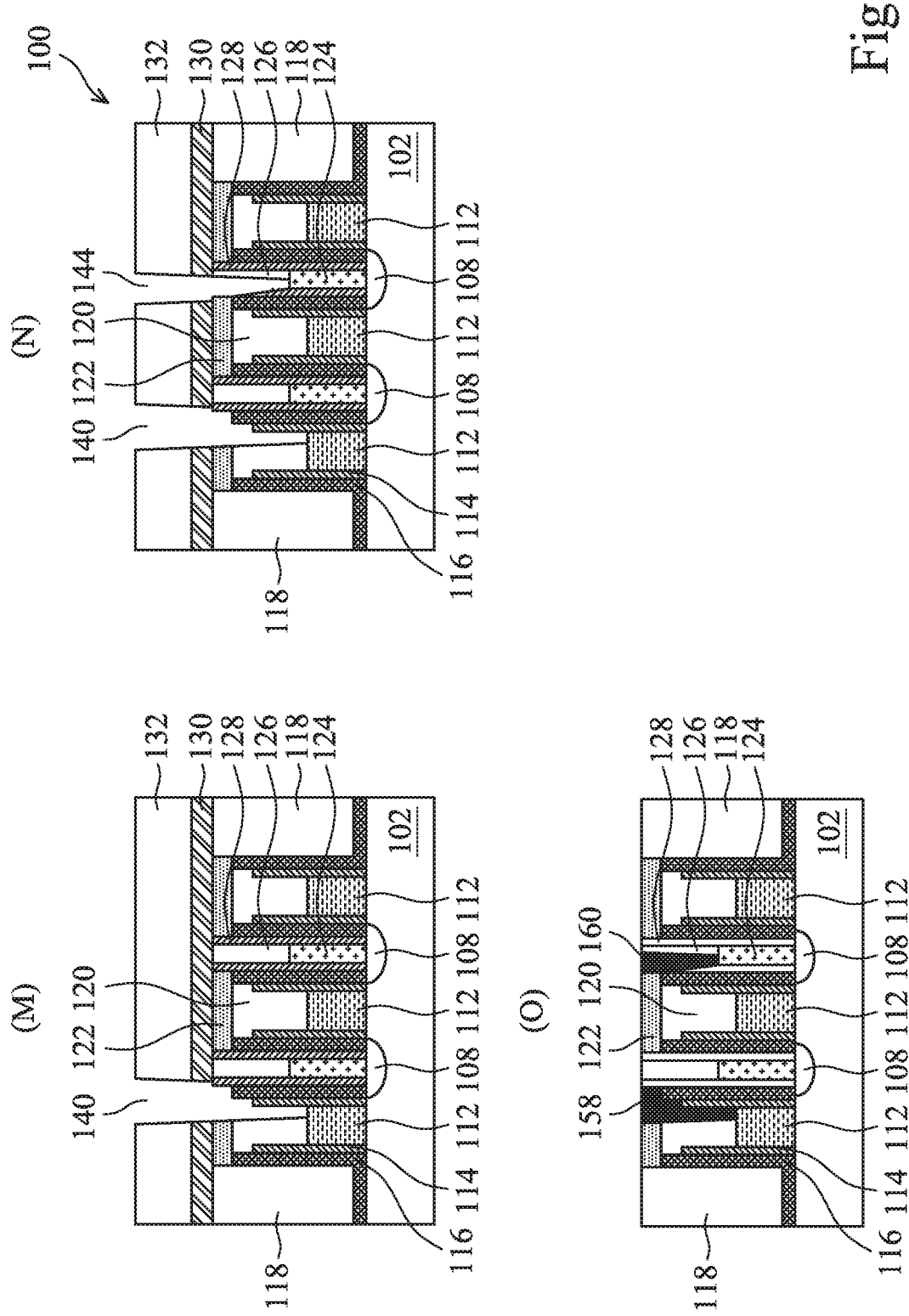

FIG. 5 is a flowchart of a process 200 for fabricating the semiconductor structure 100 according to various embodiments. FIGS. 6(A)-6(O) are sectional views of the semiconductor structure 100 at various fabrication stages according to various embodiments.

Referring to FIGS. 5 and 6(A), the process 200 starts at block 202 by forming the gate stack 112, gate spacer 114, etch stop layer 116, and first ILD layer 118 on the semiconductor substrate 102. In some embodiments, the semiconductor substrate 102 may be made of silicon or other semiconductor materials. Alternatively or additionally, the semiconductor substrate 102 may include other elementary semiconductor materials such as germanium. In some embodiments, the semiconductor substrate 102 is made of a compound semiconductor such as silicon carbide, gallium arsenic, indium arsenide, or indium phosphide. In some embodiments, the semiconductor substrate 102 is made of an alloy semiconductor such as silicon germanium, silicon germanium carbide, gallium arsenic phosphide, or gallium indium phosphide. In some embodiments, the semiconductor substrate 102 includes an epitaxial layer. For example, the semiconductor substrate 102 has an epitaxial layer overlying a bulk semiconductor. The semiconductor substrate 102 may, in some examples, include a semiconductor-on-insulator substrate, such as Si-on-insulator (SOI), SiGe-on-insulator (SGOI), Ge-on-insulator (GOI) substrates.

In some embodiments, block 202 includes forming a dummy gate (not shown) on the semiconductor substrate 102 by depositing a dummy gate material and patterning the dummy gate material. Each dummy gate may include one or more material layers, such as an oxide layer (i.e., a dummy gate dielectric layer), a poly-silicon layer (i.e., a dummy gate electrode), a hard mask layer, a capping layer, and/or other suitable layers. During fabrication, a gate replacement process will be performed to replace the dummy gate with the gate stack 112, as described further below. In other words, the dummy gate is formed as a placeholder before forming other components, e.g., source/drain features. Once the other components have been formed, the dummy gate is removed and the gate stack 112 is formed in its place.

In some embodiments, the gate spacer 114 is formed by depositing a spacer dielectric material over the dummy gate, followed by performing an anisotropic etching process to remove portions of the spacer dielectric material other than the gate spacers 114 disposed on sidewalls of the dummy gate. In some embodiments, the anisotropic etching process is a dry (e.g. plasma) etching process. Additionally or alternatively, the formation of the gate spacers 114 may also involve chemical oxidation, thermal oxidation, atomic layer deposition (ALD), chemical vapor deposition (CVD), and/or other suitable methods. In some embodiments, the spacer dielectric material includes SiC, LaO, AlO, AlON, ZrO, HfO, SiN, Si, ZnO, ZrN, ZrAlO, TiO, TaO, YO, TaCN, ZrSi, SiOCN, SiOC, SiCN, HfSi, LaO, SiO, or combinations thereof. Following etching, a width of the gate spacer 114 may range from approximately 1-10 nm.

In some embodiments, the source/drain 108 is formed in openings between the gate spacers 114. The source/drain 108 may be formed by any suitable techniques, such as etching processes followed by one or more epitaxy processes. In one example, one or more etching processes are performed to remove portions of the semiconductor substrate 102 to form a recess therein. A cleaning process may be performed to clean the recess with a hydrofluoric acid (HF) solution or other suitable solution. Subsequently, one or more epitaxial growth processes are performed to grow an epitaxial feature in the recess. Therefore, the source/drain 108 is sometimes called an epitaxial source/drain feature or simply an epitaxial feature. The source/drain 108 may be suitable for a p-type CMOS or FinFET device (e.g., a p-type epitaxial material) or alternatively, an n-type CMOS or FinFET device (e.g., an n-type epitaxial material). The p-type epitaxial material may include one or more epitaxial layers of silicon germanium (epi SiGe), where the silicon germanium is doped with a p-type dopant such as boron, germanium, indium, and/or other p-type dopants. The n-type epitaxial material may include one or more epitaxial layers of silicon (epi Si) or silicon carbon (epi SiC), where the silicon or silicon carbon is doped with an n-type dopant such as arsenic, phosphorus, and/or other n-type dopant.

In some embodiments, the etch stop layer 116 is formed by depositing an etch stop material over the semiconductor substrate 102, followed by performing another anisotropic etching process to remove portions of the etch stop material other than the etch stop layers 116 disposed on sidewalls of the gate spacers 114. In some embodiments, the etch stop material includes SiC, LaO, AlO, AlON, ZrO, HfO, SiN, Si, ZnO, ZrN, ZrAlO, TiO, TaO, YO, TaCN, ZrSi, SiOCN, SiOC, SiCN, HfSi, LaO, SiO, or combinations thereof.

Following etching, a width of the etch stop layer 116 may range from approximately 1-10 nm.

In some embodiments, the ILD layer 118 is formed by depositing a dielectric material over the semiconductor substrate 102, followed by performing a chemical mechanical polishing (CMP) process to the dielectric material. The ILD layer 118 includes a low-k dielectric material in some embodiments, or SiO in some other embodiments.

In some embodiments, a gate replacement process is performed to replace the dummy gate with the gate stack 112. In some embodiments, the gate stack 112 has a width ranging from approximately 2-50 nm. In an embodiment, an etching process is used to form a gate trench by removing the dummy gate using a dry etching process, a wet etching process, a RIE process, other suitable methods, or combinations thereof. A dry etching process may use chlorine-containing gases, fluorine-containing gases, and/or other etching gases. Wet etching solutions may include ammonium hydroxide ($NH_4OH$), hydrofluoric acid (HF) or diluted HF, deionized water, tetramethylammonium hydroxide (TMAH), and/or other suitable wet etching solutions.

The gate stack 112 includes a gate electrode and a gate dielectric layer below the gate electrode. The gate electrode may include polysilicon or metal. The metal may include tantalum nitride (TaN), nickel silicon (NiSi), cobalt silicon (CoSi), molybdenum (Mo), copper (Cu), tungsten (W), aluminum (Al), cobalt (Co), zirconium (Zr), platinum (Pt), or other applicable materials. The gate electrode may be formed in a gate last process (or gate replacement process). Hard mask layers may be used to define the gate electrode. A dielectric layer may also be formed on sidewalls of the gate electrode and over the hard mask layers. The gate dielectric layer may include dielectric materials, such as silicon oxide, silicon nitride, silicon oxynitride, dielectric material(s) with high dielectric constant (high-k), or combinations thereof. Examples of high-k dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, or combinations thereof. In some embodiments, the gate stack 112 includes additional layers, such as interfacial layers, capping layers, diffusion/barrier layers, or other applicable layers.

The gate stack 112 may be formed by a deposition process, a photolithography process, and an etching process. The deposition process may include CVD, physical vapor deposition (PVD), ALD, high density plasma CVD (HDPCVD), metal organic CVD (MOCVD), remote plasma CVD (RPCVD), plasma enhanced CVD (PECVD), plating, other suitable methods, and/or combinations thereof. The photolithography processes may include photoresist coating (e.g., spin-on coating), soft baking, mask aligning, exposure, post-exposure baking, developing the photoresist, rinsing, and drying (e.g., hard baking). The etching process may include a dry etching process or a wet etching process. Alternatively, the photolithography process is implemented or replaced by other proper methods such as maskless photolithography, electron-beam writing, and ion-beam writing.

Referring to FIGS. 5 and 6(B), the process 200 proceeds to block 204 by etching back the gate stack 112 and a portion of the gate spacer 114 above the gate stack 112 forming a trench 154. The etching back of the gate stack 112 and the portion of the gate spacer 114 exposes inner sidewalls of the gate spacers 114 and the etch stop layers 116 in the trench 154. Additionally, recessed top surfaces of the gate stack 112 and the gate spacers 114 are exposed in the trench 154. In some embodiments, the gate stack 112 and the gate spacers 114 are etched back using a dry etching process, a wet etching process, a RIE process, other suitable methods, or combinations thereof. A dry etching process may use chlorine-containing gases, fluorine-containing gases, and/or other etching gases. Wet etching solutions may include ammonium hydroxide ($NH_4OH$), hydrofluoric acid (HF) or diluted HF, deionized water, tetramethylammonium hydroxide (TMAH), and/or other suitable wet etching solutions. In some embodiments, the etching process includes multiple etching steps with different etching chemistries, designed for etching selectivity to form features having a desired profile. The gate stack 112 may be etched back to the first height, and the gate spacers 114 may be etched back to the second height greater than the first height. In some embodiments, a ratio of the second height to the first height may range from approximately 1:1 to 3:1. In some embodiments, the second height may range from approximately ½ to ¾ of a height of the etch stop layers 116.

Referring to FIGS. 5 and 6(C), the process 200 proceeds to block 206 by forming the first SAC dielectric feature 120 in the trench 154. The first SAC dielectric feature 120 may be disposed on the top surface of the recessed gate stack 112, the top surfaces of the recessed gate spacers 114, and inner sidewalls of the gate spacers 114 and the etch stop layers 116. In some embodiments, the first SAC dielectric feature 120 has a chemical composition different than a chemical composition of the gate spacers 114 for VG etching selectivity. In some embodiments, the first SAC dielectric feature 120 includes SiC, LaO, AlO, AlON, ZrO, HfO, SiN, Si, ZnO, ZrN, ZrAlO, TiO, TaO, YO, TaCN, ZrSi, SiOCN, SiOC, SiCN, HfSi, LaO, SiO, or combinations thereof. In some embodiments, the first SAC dielectric feature 120 may be deposited by any suitable method, such as CVD, PECVD, FCVD, HDPCVD, sub-atmospheric CVD (SACVD), high-aspect ratio process (HARP), a spin-on process, or a combination thereof.

Referring to FIGS. 5 and 6(D), the process 200 proceeds to block 208 by recessing the first SAC dielectric feature 120. In some embodiments, the first SAC dielectric feature 120 is recessed using a dry etching process, a wet etching process, a RIE process, other suitable methods, or combinations thereof. A dry etching process may use chlorine-containing gases, fluorine-containing gases, and/or other etching gases. Wet etching solutions may include ammonium hydroxide ($NH_4OH$), hydrofluoric acid (HF) or diluted HF, deionized water, tetramethylammonium hydroxide (TMAH), and/or other suitable wet etching solutions. In some embodiments, the etching process includes multiple etching steps with different etching chemistries, designed for etching selectivity to form features having a desired profile. After recessing, the first SAC dielectric feature 120 has a T-shape including a lower portion having a first width and an upper portion having a second width greater than the first width. Outer edges of the lower portion laterally contact inner sidewalls of the gate spacers 114. Likewise, outer edges of the upper portion laterally contact inner sidewalls of the etch stop layers 116. The T-shape of the first SAC dielectric feature 120 includes downward facing surfaces between the lower portion and the upper portion, wherein the downward facing surfaces horizontally contact top surfaces of the gate spacers 114. The first width of the lower portion is equal to the width of the gate stack 112, wherein outer edges of the lower portion are aligned with outer edges of the gate stack 112. In some embodiments, the first width may range from approximately 2-50 nm. The second width of the upper portion is equal to a total of the width of the gate stack 112 and the widths of the gate spacers 114 on each side of the gate stack 112, wherein outer edges of the upper portion are aligned with outer edges of the gate spacers 114. In some embodiments, the second width may range from approximately 4-70 nm. A thickness of each of the lower and upper portions may range from approximately 1-50 nm. The thickness of the lower portion of the first SAC dielectric feature 120 is equal to a distance the gate spacer 114 extends above a top surface of the gate stack 112. In some embodiments, the thickness of the lower portion and the extension of the gate spacer 114 above the top surface of the gate stack 112 may range from approximately 1-50 nm. Furthermore, the thickness of the upper portion of the first SAC dielectric feature 120 is equal to a distance the etch stop layer 116 extends above the top surface of the gate spacer 114. In some embodiments, the thickness of the upper portion and the extension of the etch stop layer 116 above the top surface of the gate spacer 114 may range from approximately 1-50 nm.

Referring to FIGS. 5 and 6(E), the process 200 proceeds to block 210 by etching back a portion of the etch stop layer 116 above the first SAC dielectric feature 120. In some embodiments, the etch stop layer 116 is etched back using a dry etching process, a wet etching process, a RIE process, other suitable methods, or combinations thereof. A dry etching process may use chlorine-containing gases, fluorine-containing gases, and/or other etching gases. Wet etching solutions may include ammonium hydroxide ($NH_4OH$), hydrofluoric acid (HF) or diluted HF, deionized water, tetramethylammonium hydroxide (TMAH), and/or other suitable wet etching solutions. In some embodiments, the etching process includes multiple etching steps with different etching chemistries, designed for etching selectivity to form features having a desired profile. The etch stop layer 116 may be etched back to the third height greater than the second height of the gate spacer 114. In some embodiments, a ratio of the third height to the second height may range from approximately 1:1 to 2:1. In some embodiments, the third height may range from approximately ½ to ¾ of the height of the etch stop layer 116 before etching. In some embodiments, the top surface of the first SAC dielectric feature 120 is coplanar with the top surface of the etch stop layer 116 after etching back the etch stop layer 116. In some embodiments, the etching back of the etch stop layer 116 exposes lateral surfaces of the first ILD layer 118 in the trench 154.

Referring to FIGS. 5 and 6(F), the process 200 proceeds to block 212 by forming the second SAC dielectric feature 122 on the first SAC dielectric feature 120 and the etch stop layer 116, followed by performing CMP on the second SAC dielectric feature 122. The second SAC dielectric feature 122 laterally contacts the first ILD layer 118 and contacts the top surface of the etch stop layer 116 and the top surface of the first SAC dielectric feature 120. In some embodiments, the second SAC dielectric feature 122 has a chemical composition different than a chemical composition of the first SAC dielectric feature 120. In some embodiments, the second SAC dielectric feature 122 includes SiC, LaO, AlO, AlON, ZrO, HfO, SiN, Si, ZnO, ZrN, ZrAlO, TiO, TaO, YO, TaCN, ZrSi, SiOCN, SiOC, SiCN, HfSi, LaO, SiO, or combinations thereof. In some embodiments, the second SAC dielectric feature 122 may be deposited by any suitable method, such as CVD, PECVD, FCVD, HDPCVD, sub-atmospheric CVD (SACVD), high-aspect ratio process (HARP), a spin-on process, or a combination thereof. Following CMP, a thickness of the second SAC dielectric feature 122 may range from approximately 1-30 nm. A width of the second SAC dielectric feature 122 is equal to a total of the width of the gate stack 112, the widths of the gate spacers 114 on each side of the gate stack 112, and the widths of the etch stop layers 116 on each side of the gate stack 112, wherein outer edges of the second SAC dielectric feature 122 are aligned with outer edges of the etch stop layers 116. In some embodiments, the width of the second SAC dielectric feature 122 may range from approximately 6-90 nm. Following CMP, the first ILD layer 118 may have the fourth height greater than the third height of the etch stop layer 116, a top surface of the second SAC dielectric feature 122 being coplanar with the top surface of the first ILD layer 118.

Referring to FIGS. 5 and 6(G), the process 200 proceeds to block 214 by performing an MD etching process using the patterned hard mask 134 to form the S/D contact opening 136. The patterned hard mask 134 is formed by a procedure that includes deposition, lithography process, and etching. The lithography process may include photoresist deposition, exposure, and development to form a patterned photoresist for etching to form the patterned hard mask 134. After forming the patterned hard mask 134, the photoresist may be removed by plasma ashing. In some embodiments, the photoresist may be used directly as an etch mask for the MD etching process. The patterned hard mask 134 may be removed after the MD etching process.

In some embodiments, the MD etching process includes selectively etching a portion of the ILD layer 118 without etching the second SAC dielectric feature 122 to expose a top surface of the source/drain 108 and a sidewall of the etch stop layer 116 opposite the gate spacer 114. The MD etching process may also expose lateral surfaces of the second SAC dielectric feature 122. The MD etching process may include a dry etching process, a wet etching process, a RIE process, other suitable methods, or combinations thereof. A dry etching process may use chlorine-containing gases, fluorine-containing gases, and/or other etching gases. Wet etching solutions may include ammonium hydroxide ($NH_4OH$), hydrofluoric acid (HF) or diluted HF, deionized water, tetramethylammonium hydroxide (TMAH), and/or other suitable wet etching solutions. In some embodiments, the etching process includes multiple etching steps with different etching chemistries, designed for etching selectivity to form features having a desired profile.

Referring to FIGS. 5 and 6(H), the process 200 proceeds to block 216 by forming the liner 128 in the S/D contact opening 136. The liner 128 is formed by depositing a liner material over the exposed top surface of the source/drain 108, the exposed sidewall of the etch stop layer 116 opposite the gate spacer 114, and the exposed lateral surfaces of the second SAC dielectric feature 122. In some embodiments, the liner material is deposited conformally. Portions of the liner material contacting the source/drain 108 may be removed by performing an anisotropic etching process without removing the liner 128 physically contacting the exposed sidewall of the etch stop layer 116 opposite the gate spacer 114 and the exposed lateral surfaces of the second SAC dielectric feature 122. In some embodiments, the liner 128 has a width ranging from approximately 1-10 nm. In some embodiments, the liner 128 has a chemical composition different than the chemical composition of the second SAC dielectric feature 122 for VD etching selectivity. In some embodiments, the liner 128 includes SiC, LaO, AlO, AlON, ZrO, HfO, SiN, Si, ZnO, ZrN, ZrAlO, TiO, TaO, YO, TaCN, ZrSi, SiOCN, SiOC, SiCN, HfSi, LaO, SiO, or combinations thereof. In some embodiments, the liner may be an optional feature. In that regard, any embodiments described and/or illustrated herein may be constructed with or without the liner 128.

Referring to FIGS. 5 and 6(I), the process 200 proceeds to block 218 by forming the S/D contact 124 in the S/D contact opening 136, followed by performing CMP on the S/D contact 124. The S/D contact 124 is formed over the exposed source/drain 108. In some embodiments, a bottom surface of the S/D contact 124 is disposed on the source/drain 108. In some other embodiments, a silicide is formed on the exposed source/drain 108 and the S/D contact 124 is formed on the silicide. The silicide may lower a contact resistance of the S/D contact 124. In some embodiments, the S/D contact 124 is formed of metal and may include tungsten, alloys thereof, or compounds thereof, although other suitable materials such as aluminum, copper, platinum, ruthenium, silver, gold, rhodium, molybdenum, nickel, cobalt, cadmium, zinc, titanium, alloys of these, combinations thereof, and the like, may alternatively be utilized. In some examples, the S/D contact 124 may include a compound or alloy of one or more of the aforementioned materials combined with one or more of zirconium, tin, silver, gold, calcium, beryllium, magnesium, rhodium, sodium, iridium, potassium, indium, osmium, silicon, germanium, and manganese. Any suitable deposition method, such as PVD, CVD, ALD, plating (e.g. electroplating) may be used to form the S/D contact 124. In some embodiments, outer edges of the S/D contact 124 are disposed on sidewalls of the liner 128. In other embodiments where the liner 128 is omitted, the outer edges of the S/D contact 124 are disposed on the exposed sidewall of the etch stop layer 116 opposite the gate spacer 114 and the exposed lateral surfaces of the second SAC dielectric feature 122. Following CMP, a top surface of the S/D contact 124 may be coplanar with the top surface of the second SAC dielectric feature 122 and the top surface of the first ILD layer 118.

In some embodiments, the S/D contact 124 physically contacts the source/drain 108. In some other embodiments, the S/D contact 124 may include other layers between the S/D contact 124 and the source/drain 108. Intervening layers may include a silicide region, a barrier layer, and a seed layer. The barrier layer may include an electrically conductive material such as titanium (Ti), titanium nitride (TiN), tantalum (Ta), tantalum nitride (TaN), or the like, and may be formed using a CVD process, such as PECVD. The seed layer may be deposited by PVD, ALD, or CVD, and may be formed of tungsten, copper, or copper alloys.

Referring to FIGS. 5 and 6(J), the process 200 proceeds to block 220 by etching back the S/D contact 124. In some embodiments, the etching back of the S/D contact 124 may expose sidewalls of the liner 128. In some other embodiments, the etching back of the S/D contact 124 may re-expose an upper portion of the sidewall of the etch stop layer 116 opposite the gate spacer 114 and the lateral surfaces of the second SAC dielectric feature 122. In some embodiments, an etched top surface of the S/D contact 124 is below the second height of the gate spacer 114 and above the first height of the gate stack 112. In some other embodiments, the etched top surface of the S/D contact 124 may be below the first height of the gate stack 112, or above the second height of the gate spacer 114 and below the third height of the etch stop layer 116, or above the third height of the etch stop layer 116. In some embodiments, the S/D contact 124 is etched back using a dry etching process, a wet etching process, a RIE process, other suitable methods, or combinations thereof. A dry etching process may use chlorine-containing gases, fluorine-containing gases, and/or other etching gases. Wet etching solutions may include ammonium hydroxide ($NH_4OH$), hydrofluoric acid (HF) or diluted HF, deionized water, tetramethylammonium hydroxide (TMAH), and/or other suitable wet etching solutions. In some embodiments, the etching process includes multiple etching steps with different etching chemistries, designed for etching selectivity to form features having a desired profile.

Referring to FIGS. 5 and 6(K), the process 200 proceeds to block 222 by forming the third SAC dielectric feature 126 on the S/D contact 124, followed by performing CMP on the third SAC dielectric feature 126. In some embodiments, the third SAC dielectric feature 126 has a width ranging from approximately 2-50 nm and a thickness ranging from approximately 2-50 nm. In some embodiments, the third SAC dielectric feature 126 has a chemical composition different than the chemical composition of the second SAC dielectric feature 122 for VD etching selectivity. In some embodiments, the third SAC dielectric feature 126 includes SiC, LaO, AlO, AlON, ZrO, HfO, SiN, Si, ZnO, ZrN, ZrAlO, TiO, TaO, YO, TaCN, ZrSi, SiOCN, SiOC, SiCN, HfSi, LaO, SiO, or combinations thereof. In some embodiments, the third SAC dielectric feature 126 may be deposited by any suitable method, such as CVD, PECVD, FCVD, HDPCVD, sub-atmospheric CVD (SACVD), high-aspect ratio process (HARP), a spin-on process, or a combination thereof. In some embodiments, a bottom surface of the third SAC dielectric feature 126 is disposed on the etched top surface of the S/D contact 124. In some embodiments, outer edges of the third SAC dielectric feature 126 are disposed on sidewalls of the liner 128. In other embodiments where the liner 128 is omitted, the outer edges of the third SAC dielectric feature 126 are disposed on the re-exposed upper portion of the sidewall of the etch stop layer 116 opposite the gate spacer 114 and the exposed lateral surfaces of the second SAC dielectric feature 122. Following CMP, a top surface of the third SAC dielectric feature 126 may be coplanar with the top surface of the second SAC dielectric feature 122 and the top surface of the first ILD layer 118.

Referring to FIGS. 5 and 6(L), the process 200 proceeds to block 224 by forming the metal contact etch stop layer 130 and the second ILD layer 132. In some embodiments, the metal contact etch stop layer 130 or the second ILD layer 132, when the metal contact etch stop layer 130 is omitted, may be disposed on the top surface of the second SAC dielectric feature 122, the top surface of the first ILD layer 118, the top surface of the third SAC dielectric feature 126, and top surfaces of the liner 128. In some embodiments, the metal contact etch stop layer 130 and the second ILD layer 132 have a different chemical composition from each other. In some embodiments, each of the metal contact etch stop layer 130 and the second ILD layer 132 includes SiC, LaO, AlO, AlON, ZrO, HfO, SiN, Si, ZnO, ZrN, ZrAlO, TiO, TaO, YO, TaCN, ZrSi, SiOCN, SiOC, SiCN, HfSi, LaO, SiO, or combinations thereof. In some embodiments, each of the metal contact etch stop layer 130 and the second ILD layer 132 are optional layers. In that regard, any embodiments described and/or illustrated herein may be constructed with or without each of the metal contact etch stop layer 130 and the second ILD layer 132. In some embodiments, a thickness of each of the metal contact etch stop layer 130 and the second ILD layer 132 ranges from approximately 1-60 nm.

Referring to FIGS. 5 and 6(M), the process 200 proceeds to block 226 by performing a VG etching process to form the gate contact opening 140. In some embodiments, the gate contact opening 140 includes a contact hole. In some other embodiments, the VG etching process may form the gate contact opening slot 150, 152. In that regard, any embodiments described and/or illustrated herein may be constructed with either the gate contact opening 140 or the gate contact opening slot 150, 152. In some embodiments, the VG etching process includes selectively etching a portion of the first and second SAC dielectric features 120, 122 without etching the gate spacer 114 to expose a top surface of the gate stack 112. In some embodiments, the VG etching process may be prevented from etching the etch stop layer 116 and the liner 128 while also etching portions of the metal contact etch stop layer 130 and the second ILD layer 132. Thus, the VG etching process may expose lateral surfaces of the first and second SAC dielectric features 120, 122 and sidewall portions of the gate spacer 114, the etch stop layer 116 and the liner 128. The VG etching process may include a dry etching process, a wet etching process, a RIE process, other suitable methods, or combinations thereof. A dry etching process may use chlorine-containing gases, fluorine-containing gases, and/or other etching gases. Wet etching solutions may include ammonium hydroxide (NH$_4$OH), hydrofluoric acid (HF) or diluted HF, deionized water, tetramethylammonium hydroxide (TMAH), and/or other suitable wet etching solutions. In some embodiments, the etching process includes multiple etching steps with different etching chemistries, designed for etching selectivity to form features having a desired profile.

Referring to FIGS. 5 and 6(N), the process 200 proceeds to block 228 by performing a VD etching process to form the opening 144. In some embodiments, the opening 144 includes a contact hole or a slot. In some embodiments, the VD etching process includes selectively etching a portion of the third SAC dielectric feature 126 and a portion of the liner 128 without etching the second SAC dielectric feature 122 to expose a top surface of the S/D contact 124. Thus, the VD etching process may expose a lateral surface of the second SAC dielectric feature 122 and sidewall portions of the third SAC dielectric feature 126 and the liner 128. The VD etching process may include a dry etching process, a wet etching process, a RIE process, other suitable methods, or combinations thereof. A dry etching process may use chlorine-containing gases, fluorine-containing gases, and/or other etching gases. Wet etching solutions may include ammonium hydroxide (NH$_4$OH), hydrofluoric acid (HF) or diluted HF, deionized water, tetramethylammonium hydroxide (TMAH), and/or other suitable wet etching solutions. In some embodiments, the etching process includes multiple etching steps with different etching chemistries, designed for etching selectivity to form features having a desired profile.

Referring to FIGS. 5 and 6(O), the process 200 proceeds to block 230 by depositing a conductive layer over the semiconductor structure 100 including forming a gate via 158 in the gate contact opening 140 and an S/D via 160 in the opening 144. In some embodiments, the conductive layer is deposited conformally. In some embodiments, the gate via 158 and the S/D via 160 are formed of metal and may include aluminum, copper, aluminum/silicon/copper alloy, cobalt, nickel, titanium, tungsten, platinum, ruthenium, silver, gold, rhodium, molybdenum, cadmium, zinc and alloys, compounds, or combinations thereof. The gate via 158 and the S/D via 160 may be formed by any suitable deposition method, such as PVD, CVD, ALD, plating (e.g. electroplating), or combinations thereof. In some embodiments, the gate via 158 and the S/D via 160 may include a barrier layer. The barrier layer may include an electrically conductive material such as titanium (Ti), titanium nitride (TiN), tantalum (Ta), tantalum nitride (TaN), or the like, and may be formed using a CVD process, such as PECVD. In some embodiments, the gate via 158 and the S/D via 160 may include a seed layer. The seed layer may be deposited by PVD, ALD, or CVD, and may be formed of tungsten, copper, or copper alloys. In some embodiments, the gate via 158 and the S/D via 160 are deposited on the seed layer.

The gate via 158 may be disposed on the top surface of the gate stack 112, inner sidewalls and top surfaces of the gate spacer 114 and the etch stop layer 116, the sidewall of the liner 128, and lateral surfaces of the first and second SAC dielectric features 120, 122. The S/D via 160 may be disposed on the top surface of the S/D contact 124, the lateral surface of the second SAC dielectric feature 122, and sidewall portions of the third SAC dielectric feature 126 and the liner 128. After depositing the conductive layer, a CMP process may be performed on the semiconductor structure 100 to remove excess metal of the conductive layer and to remove the metal contact etch stop layer 130 and the second ILD layer 132, thereby planarizing the top surface of the semiconductor structure 100 and exposing the top surface of the second SAC dielectric feature 122 and top surfaces of the gate via 158 and the S/D via 160. In some embodiments, the top surface of the second SAC dielectric feature 122 and the top surfaces of the gate via 158 and the S/D via 160 may be coplanar with each other after performing the CMP process.

Figure 7:
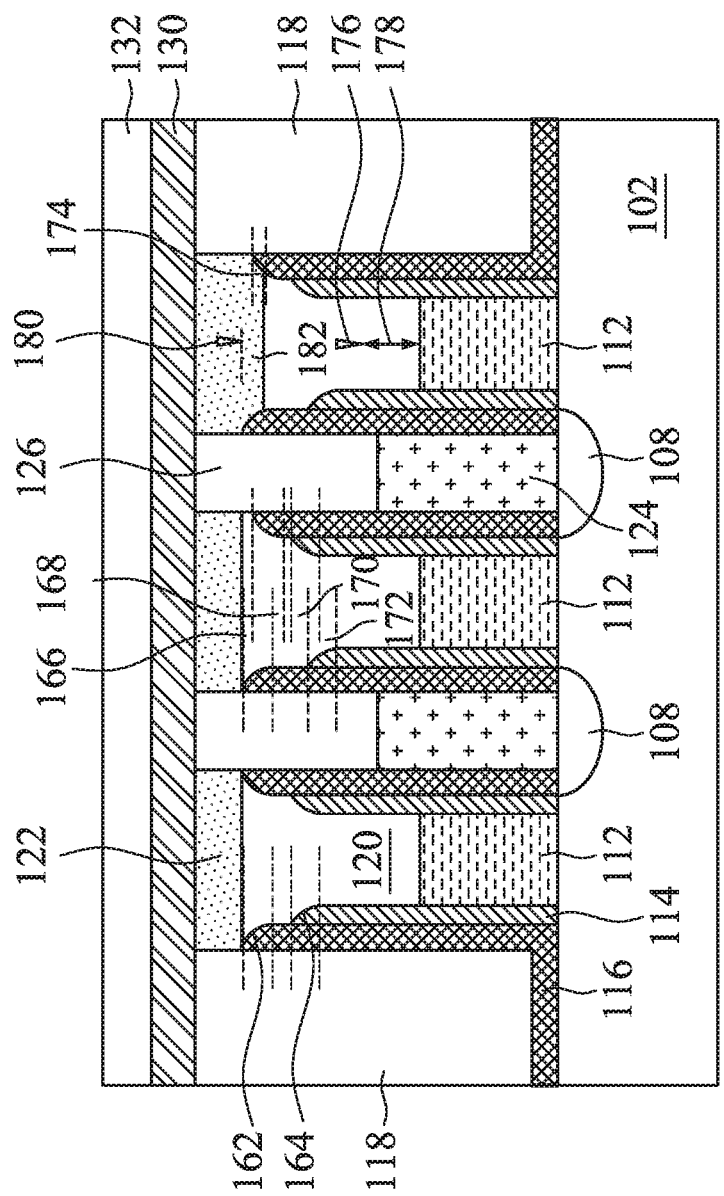
FIG. 7 is a sectional view of the semiconductor structure 100 according to various embodiments, illustrating various materials and dimensions.

FIG. 7 is a sectional view of the semiconductor structure 100 according to various embodiments, illustrating various materials and dimensions. In some embodiments, features of the semiconductor structure 100 include horizontal, vertical, and rounded edges and/or surfaces. In some implementations, the etch stop layer 116 may include a rounded upper edge 162 and the gate spacer 114 may include a rounded upper edge 164. The rounded upper edges 162, 164 may have radii ranging from approximately 0.1-15 nm. In some embodiments, the rounded upper edges 162, 164 are optional. In some implementations, the etch stop layers 116 may include top surfaces at different heights creating a height difference 166. The height difference 166 may range from approximately 0.1-20 nm. In some embodiments, the height difference 166 is optional. In some implementations, the etch stop layers 116 may include bottommost portions of rounded upper edges 162 at different heights creating a height difference 168. The height difference 168 may range from approximately 0.1-20 nm. In some embodiments, the height difference 168 is optional.

In some implementations, the gate spacers 114 may include top surfaces at different heights creating a height difference 170. The height difference 170 may range from approximately 0.1-20 nm. In some embodiments, the height difference 170 is optional. In some implementations, the gate spacers 114 may include bottommost portions of rounded upper edges 164 at different heights creating a height difference 172. The height difference 172 may range from approximately 0.1-20 nm. In some embodiments, the height difference 172 is optional. In some implementations, the second SAC dielectric feature 122 may include a portion 174 extending below the top surface of the etch stop layer 116. The depth of the extension 174 may range from approximately 0.1-30 nm. In some embodiments, the extension portion 174 is optional.

In some embodiments, the first SAC dielectric feature 120 may include a void 176. The void 176 may be disposed a height 178 above the top surface of the S/D contact 124. The height 178 may range from approximately 0.1-30 nm. The void 176 includes each of a thickness (vertical) and a width ranging from approximately 0.1-30 nm. In some embodiments, the second SAC dielectric feature 122 may include a void 180. The void 180 may be disposed a height 182 above the top surface of the first SAC dielectric feature 120. The height 182 may range from approximately 0.1-30 nm. The void 180 includes each of a thickness (vertical) and a width ranging from approximately 0.1-30 nm.

The present disclosure provides a semiconductor structure in accordance with some embodiments. The semiconductor structure includes a gate stack disposed on a semiconductor substrate and having a first height; a spacer disposed on a sidewall of the gate stack and having a second height greater than the first height; a first etch stop layer disposed on a sidewall of the gate spacer and having a third height greater than the second height; a first dielectric layer disposed over the gate stack and contacting the gate spacer and the first etch stop layer; and a second dielectric layer disposed on the first dielectric layer and contacting the first etch stop layer.

The present disclosure provides a method for fabricating a semiconductor structure in accordance with some embodiments. The method includes forming a gate stack on a semiconductor substrate with a gate spacer on a sidewall of the gate stack and an etch stop layer on a sidewall of the gate spacer and an interlayer dielectric (ILD) layer surrounding the gate stack, the gate spacer and the etch stop layer; etching back the gate stack to a first height, resulting in a trench; etching the gate spacer to a second height greater than the first height; depositing a first dielectric layer in the trench; recessing the first dielectric layer; removing a portion of the etch stop layer above the first dielectric layer such that the etch stop layer has a third height greater than the second height; and forming a second dielectric layer on the first dielectric layer and the etch stop layer, the second dielectric layer laterally contacting sidewalls of the ILD layer.

In some embodiments, the semiconductor structure includes a gate stack disposed on a semiconductor substrate; a spacer disposed on a sidewall of the gate stack; an etch stop layer disposed on a first sidewall of the gate spacer; a first dielectric layer disposed on the gate stack and contacting the gate spacer and the etch stop layer, the first dielectric layer having a T-shape; and a second dielectric layer disposed on the first dielectric layer and contacting the etch stop layer, the second dielectric layer being wider than the first dielectric layer.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor structure, comprising:
    a gate stack disposed on a semiconductor substrate and having a first height;
    a spacer disposed on a sidewall of the gate stack and having a second height greater than the first height;
    a first etch stop layer disposed on a sidewall of the gate spacer and having a third height greater than the second height;
    a first dielectric layer disposed over the gate stack and contacting the gate spacer and the first etch stop layer; and
    a second dielectric layer disposed on the first dielectric layer and contacting the first etch stop layer.

2. The semiconductor structure of claim 1, wherein the first dielectric layer has a top surface being coplanar with a top surface of the first etch stop layer.

3. The semiconductor structure of claim 2, wherein the second dielectric layer has a bottom surface contacting the top surface of the first etch stop layer.

4. The semiconductor structure of claim 3, wherein the second dielectric layer is distanced away from the gate spacer.

5. The semiconductor structure of claim 3, further comprising:
    an interlayer dielectric (ILD) layer disposed on the semiconductor substrate and surrounding the gate stack; and
    a second etch stop layer disposed on the ILD layer and the second dielectric layer.

6. The semiconductor structure of claim 1, wherein
    the gate stack laterally spans a first width;
    the first dielectric layer laterally spans a second width being greater than the first width; and
    the second dielectric layer laterally spans a third width being greater than the second width.

7. The semiconductor structure of claim 1, wherein
    the second dielectric layer includes an outer edge aligned with an outer edge of the first etch stop layer; and
    the first dielectric layer includes an outer edge aligned with an outer edge of the gate spacer.

8. A method of forming an integrated circuit structure, comprising:
    forming a gate stack on a semiconductor substrate with a gate spacer on a sidewall of the gate stack and an etch stop layer on a sidewall of the gate spacer and an interlayer dielectric (ILD) layer surrounding the gate stack, the gate spacer and the etch stop layer;
    etching back the gate stack to a first height, resulting in a trench;
    etching the gate spacer to a second height greater than the first height;
    depositing a first dielectric layer in the trench;
    recessing the first dielectric layer;
    removing a portion of the etch stop layer above the first dielectric layer such that the etch stop layer has a third height greater than the second height; and
    forming a second dielectric layer on the first dielectric layer and the etch stop layer, the second dielectric layer laterally contacting sidewalls of the ILD layer.

9. The method of claim 8, wherein the forming of the gate stack includes:
    forming a dummy gate on the semiconductor substrate;
    forming the gate spacer on a sidewall of the dummy gate;
    forming the etch stop layer on the sidewall of the gate spacer and on the semiconductor substrate; and
    forming the ILD layer on the semiconductor substrate.

10. The method of claim 9, wherein:
    the forming of the dummy gate includes depositing a dummy gate material and patterning the dummy gate material;
    the forming of the gate spacer includes depositing a spacer dielectric material and performing an anisotropic etching process to the spacer dielectric material; and
    the forming of the ILD layer includes depositing a low-k dielectric material and performing a chemical mechanical polishing (CMP) process to the low-k dielectric material.

11. The method of claim 8, wherein the forming of the second dielectric layer includes:

depositing the second dielectric layer on the first dielectric layer; and performing a CMP process to the second dielectric layer and the ILD layer such that a top surface of the second dielectric layer is coplanar with a top surface of the ILD layer.

12. The method of claim 8, wherein the removing of the portion of the etch stop layer above the first dielectric layer includes performing a selective etching process to remove the portion of the etch stop layer such that a top surface of the etch stop layer is coplanar with a top surface of the first dielectric layer.

13. The method of claim 8, further comprising forming an S/D contact contacting a source/drain including:

selectively etching a portion of the ILD layer without etching the second dielectric layer to expose a top surface of the source/drain and a sidewall of the etch stop layer opposite the gate spacer;

depositing the S/D contact over the exposed source/drain;

etching back the S/D contact below the third height of the etch stop layer; and depositing a third dielectric layer on the S/D contact.

14. The method of claim 13, further comprising forming a silicide on the exposed source/drain and depositing the S/D contact on the silicide.

15. The method of claim 8, further comprising forming a gate via contacting the gate stack including:

selectively etching a portion of the first and second dielectric layers without etching the gate spacer to expose a top surface of the gate stack; and depositing a conductive layer to form the gate via on the exposed top surface of the gate stack.

16. The method of claim 13, further comprising forming an S/D via contacting the S/D contact including:

selectively etching a portion of the third dielectric layer without etching the second dielectric layer to expose a top surface of the S/D contact; and depositing a conductive layer to form the S/D via on the exposed top surface of the S/D contact.

17. A semiconductor structure, comprising:

a gate stack disposed on a semiconductor substrate;

a spacer disposed on a sidewall of the gate stack;

an etch stop layer disposed on a first sidewall of the gate spacer;

a first dielectric layer disposed on the gate stack and contacting the gate spacer and the etch stop layer, the first dielectric layer having a T-shape; and a second dielectric layer disposed on the first dielectric layer and contacting the etch stop layer, the second dielectric layer being wider than the first dielectric layer.

18. The semiconductor structure of claim 17, wherein the gate stack laterally spans a first width;

the first dielectric layer laterally spans a second width being greater than the first width; and the second dielectric layer laterally spans a third width being greater than the second width.

19. The semiconductor structure of claim 17, further comprising a gate via contacting a top surface of the gate stack, a second sidewall of the gate spacer opposite the first sidewall, and a sidewall of the etch stop layer.

20. The semiconductor structure of claim 17, wherein the second dielectric layer includes an outer edge aligned with an outer edge of the etch stop layer; and the first dielectric layer includes an outer edge aligned with an outer edge of the gate spacer.

\* \* \* \* \*